(12) United States Patent
Suzuki

(10) Patent No.: US 7,812,405 B2
(45) Date of Patent: Oct. 12, 2010

(54) SEMICONDUCTOR DEVICE AND METHOD OF FABRICATING THE SAME

(75) Inventor: Atsuhiro Suzuki, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 535 days.

(21) Appl. No.: 11/835,831

(22) Filed: Aug. 8, 2007

(65) Prior Publication Data

US 2008/0036095 A1 Feb. 14, 2008

(30) Foreign Application Priority Data

Aug. 8, 2006 (JP) .............................. 2006-215690

(51) Int. Cl.
*H01L 27/115* (2006.01)
(52) U.S. Cl. .................. 257/390; 257/208; 257/211
(58) Field of Classification Search .............. 257/390, 257/208, 211
See application file for complete search history.

(56) References Cited

U.S. PATENT DOCUMENTS

| | | | | |
|---|---|---|---|---|
| 5,392,233 A | * | 2/1995 | Iwase | 365/104 |
| 5,671,173 A | * | 9/1997 | Tomita | 365/63 |
| 5,825,683 A | * | 10/1998 | Chang | 365/104 |
| 5,904,559 A | | 5/1999 | Yu | |
| 6,495,870 B1 | * | 12/2002 | Sekiguchi et al. | 257/208 |
| 6,847,577 B2 | * | 1/2005 | Ishiguro | 365/230.03 |
| 7,145,199 B2 | * | 12/2006 | Kajimoto et al. | 257/314 |
| 7,244,995 B2 | * | 7/2007 | Madan | 257/380 |
| 7,489,010 B2 | * | 2/2009 | Takeuchi | 257/401 |
| 2003/0107055 A1 | * | 6/2003 | Watanabe et al. | 257/208 |
| 2009/0114951 A1 | * | 5/2009 | Lojek | 257/202 |

FOREIGN PATENT DOCUMENTS

JP 2005-142493 6/2005

* cited by examiner

*Primary Examiner*—Eugene Lee
(74) *Attorney, Agent, or Firm*—Oblon, Spivak, McClelland, Maier & Neustadt, L.L.P.

(57) ABSTRACT

A semiconductor device includes a first interlayer insulating film formed above a semiconductor substrate, a first source line formed on the first interlayer insulating film, a second interlayer insulating film formed on the first source line, a plurality of bit lines formed on the second interlayer insulating film so as to extend in a direction, the bit lines being arranged at same width and same width, a third interlayer insulating film formed above the bit lines, a second source line formed on the third interlayer insulating film, and a source shunt line formed between the second and third interlayer insulating films, the source shunt line electrically connecting the first and second source lines to each other, the source shunt line being located between the bit lines so as to extend in the same direction as the bit lines, the source shunt line including a width same as the bit lines.

6 Claims, 11 Drawing Sheets

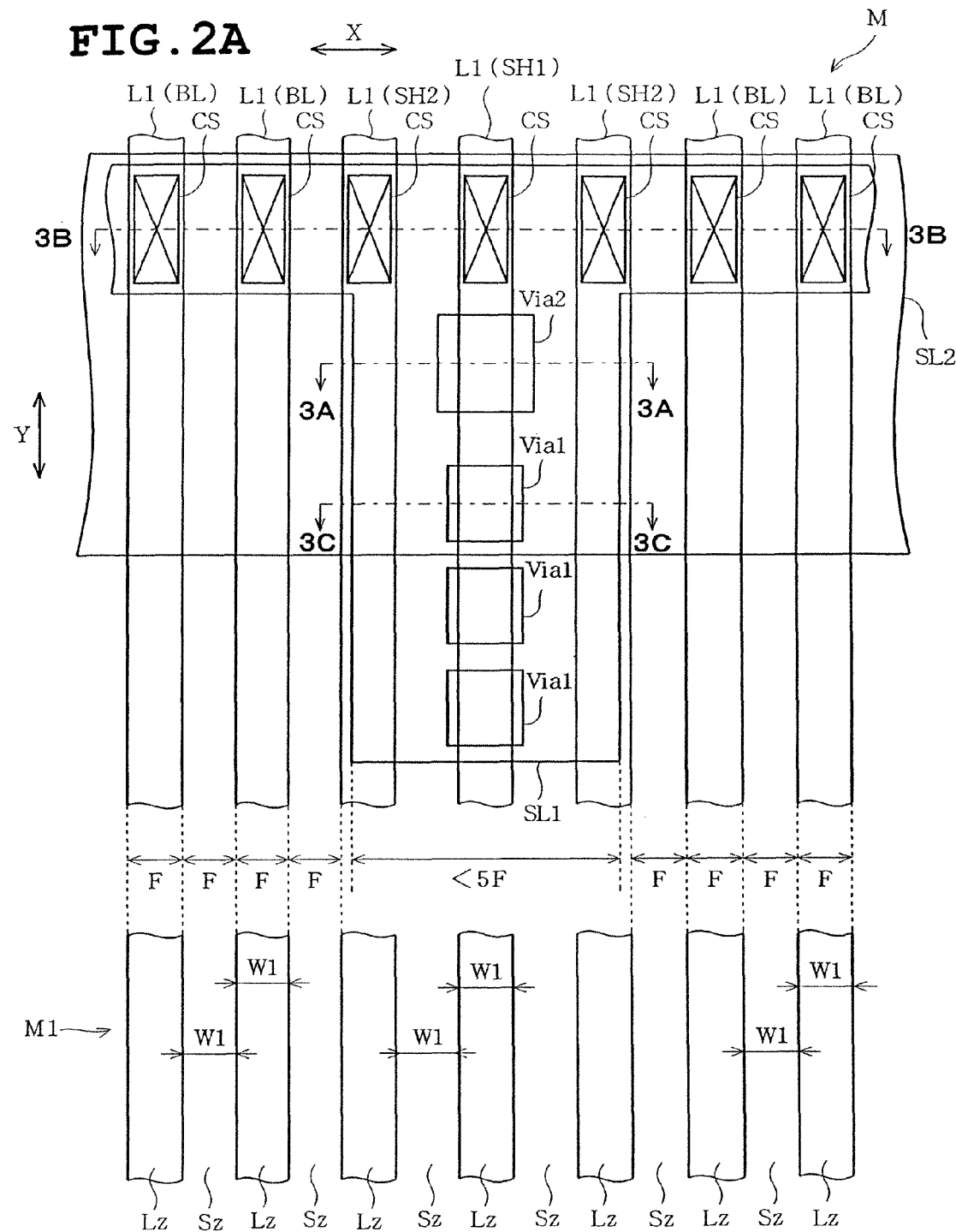

SEMICONDUCTOR DEVICE AND METHOD OF FABRICATING THE SAME

CROSS-REFERENCE TO RELATED APPLICATIONS

This application is based on and claims the benefit of priority from the prior Japanese Patent Application No. 2006-215690, filed on Aug. 8, 2006, the entire contents of which are incorporated herein by reference.

BACKGROUND OF THE INVENTION

1. Field of the Invention

The present invention relates to a semiconductor device with a multilayer interconnection structure and a method of fabricating the same.

2. Description of the Related Art

Recent structural miniaturization in semiconductor devices and scale-down in design rules have found a multilayer interconnection technology essential. Many techniques have been developed for multilayer interconnection. For example, JP-2005-142493A discloses a nonvolatile semiconductor memory device in which first source lines are connected via source line contacts on an element region of a semiconductor substrate. Source shunt lines are connected via first contacts on the first source lines. The source shunt lines are arranged in the same layer as bit line structures. Second source lines are connected via second contacts on the source shunt lines.

A large number of bit lines having respective widths with the value of F in the design rules are arranged in the same layer. On the other hand, each source shunt line structure is composed of a wider wiring having a width larger than the value of F in the design rules in order to reliably receive a source potential Vss from the second source line and to reliably supply the source potential Vss to the first source line.

Dummy spaces each of which has the same width as the wider wiring need to be provided at widthwise ends of the wider wiring in order that a sufficient width of the wider wiring may be ensured. The provision of the dummy spaces results from limitations in a lithography process. Furthermore, in order that a source node potential may be maintained at a predetermined value as much as possible, source shunt lines are provided periodically at every block so that source line potential Vss is stably supplied. However, when the source shunt lines and dummy spaces are periodically arranged for every block, a region where bit lines are to be arranged is reduced such that a reduction in a chip area occurs.

Furthermore, in order that the aforesaid wider wiring and dummy spaces may be formed, a photomask used in exposure to light needs to be provided with a pattern with a width differing from a pattern corresponding to a line width of a bit line. In this case, margins provided for exposure, illumination conditions and an optical proximity correction need to be optimized, whereupon a design efficiency is lowered. Moreover, when images of patterns with different widths are transferred to a resist, a problem of resist pattern collapse or the like occurs, thereby reducing the yield.

BRIEF SUMMARY OF THE INVENTION

Therefore, a primary object of the present invention is to provide a semiconductor device in which a region where bit lines are to be arranged can be increased so that a chip area can efficiently be utilized, and a method of fabricating such a semiconductor device.

A secondary object of the invention is to provide a semiconductor device which can eliminate the necessity of forming on the same photomask patterns with different widths for provision of bit line structure or source shunt line structure, thereby improving the design efficiency and increasing the yield.

In one aspect, the present invention provides a semiconductor device comprising a semiconductor substrate, a first interlayer insulating film formed above the semiconductor substrate, a first source line formed on the first interlayer insulating film, a second interlayer insulating film formed on the first source line, a plurality of bit lines formed on the second interlayer insulating film so as to extend in a predetermined direction, the bit lines being arranged at same width and same width each other, a third interlayer insulating film formed above the bit lines, a second source line formed on the third interlayer insulating film, and a source shunt line formed between the second and the third interlayer insulating films, the source shunt line electrically connecting the first and second source lines to each other, the source shunt line being located between the bit lines so as to extend in the same direction as the bit lines, the source shunt line including a width same as the bit lines.

In another aspect, the invention provides a method of fabricating a semiconductor device, comprising forming a first interlayer insulating film on a semiconductor substrate, forming a first plug in the first interlayer insulating film, forming a second interlayer insulating film on the first plug and the first interlayer insulating film, forming a plurality of first mask patterns on the second interlayer insulating film at predetermined intervals, each first mask pattern having a predetermined width and a space pattern above the first plug, etching the second interlayer insulating film with the first mask patterns serving as a mask, thereby forming a plurality of first linear holes including at least one first linear hole extending through the first plug, forming line structures in the first linear holes respectively, forming a third interlayer insulating film on the line structures and the second interlayer insulating film, forming a second mask pattern on the third interlayer insulating film, the second mask pattern having a hole pattern located above the line structures in contact with the first plug, etching the third interlayer insulating film with the second mask pattern serving as a mask, thereby forming a second hole extending through the line structures, and forming a second plug in the second hole.

BRIEF DESCRIPTION OF THE DRAWINGS

Other objects, features and advantages of the present invention will become clear upon reviewing the following description of one embodiment with reference to the accompanying drawings, in which:

FIG. 2A is a plan view showing a frame format of a source line contact region and peripheral structure thereof;

FIG. 2B is a view showing a frame format of a photomask pattern in relation to the view of FIG. 2A;

DETAILED DESCRIPTION OF THE INVENTION

Figure 1:
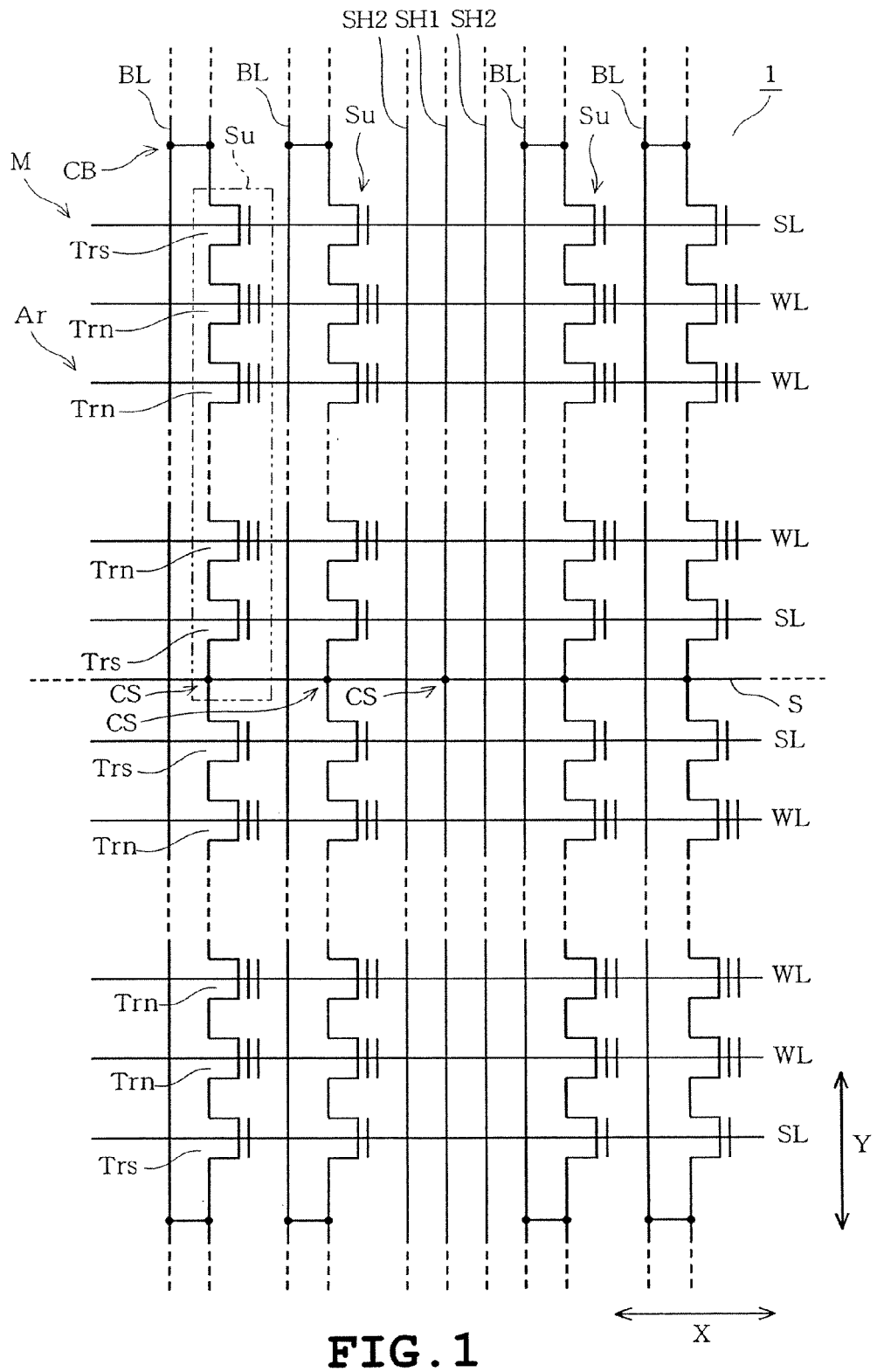
FIG. 1 is a schematic view showing an electrical arrangement and line structure of a memory cell region of an embodiment of the present invention.

One embodiment of the present invention will be described with reference to FIGS. 1 to 23. The invention is applied to a NAND flash memory in the embodiment. FIG. 1 shows an electrical circuit equivalent to a part of memory cell array composed in a memory cell region of the NAND flash memory.

The NAND flash memory 1 as a semiconductor device includes a semiconductor substrate divided into a memory cell region M and a peripheral circuit region (not shown). A memory cell array Ar is configured in the memory cell region M, whereas a peripheral circuit (not shown) for driving the memory cell array Ar is configured in the peripheral circuit region. The memory cell array Ar has a NAND cell unit Su including two selective gate transistors Trs and a plurality (8, for example; and $2^n$ (where n is a positive integer)) of memory cell transistors Trn series connected between the selective gate transistors Trs in the Y direction in FIG. 1 (corresponding to the direction of bit line or source shunt line). The memory cell array Ar is composed of NAND memory cell units Su arranged into a matrix. In one NAND cell unit Su, two selective gate transistors Trs and plural memory cell transistors Trn are arranged so that a source/drain region is shared by the selective gate transistors and memory cell transistors adjacent to each other.

The memory cell transistors Trn are aligned in the X direction (corresponding to a direction of word line) perpendicular to the Y direction in FIG. 1. The memory cell transistors Trn are commonly connected to a word line (control gate line) WL extending in the X direction in FIG. 1. Furthermore, the selective gate transistors Trs arranged in the X direction in FIG. 1 are commonly connected to the selective gate lines SL extending in the X direction in FIG. 1. One of the selective gate transistors Trs is connected to a bit line BL extending via bit line contacts CB in the Y direction in FIG. 1. The other selective gate transistor Trs is connected via a source line contact CS to the source line S. The source line S is grounded. The source line S is connected via the source line contact CS to a source shunt line SH1 extending in the Y direction in FIG. 1 in parallel to the bit lines BL. The source shunt line structure SH1 has both sides where a pair of dummy wiring structures SH2 are disposed in parallel to the source shunt line structure SH1.

When a flash memory has a bit line structure including 1000 to 1500 bits per chip, the source shunt line structure SH1 and paired dummy wirings SH2 are provided for every block of bit line structure BL having 100 to 150 bits. As a result, a source node potential can substantially be maintained at a fixed value, whereby stable application of source line potential Vss can be realized.

Figure 3A:
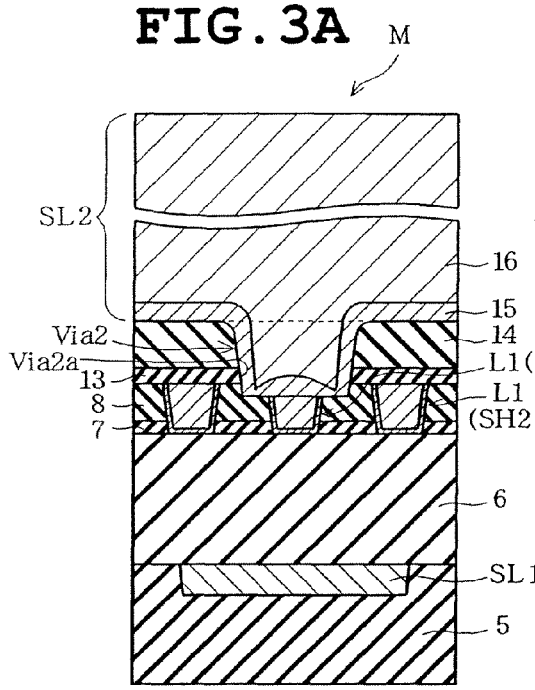
FIG. 3A is a sectional view taken along line 3A-3A in FIG. 2A.
Figure 3C:
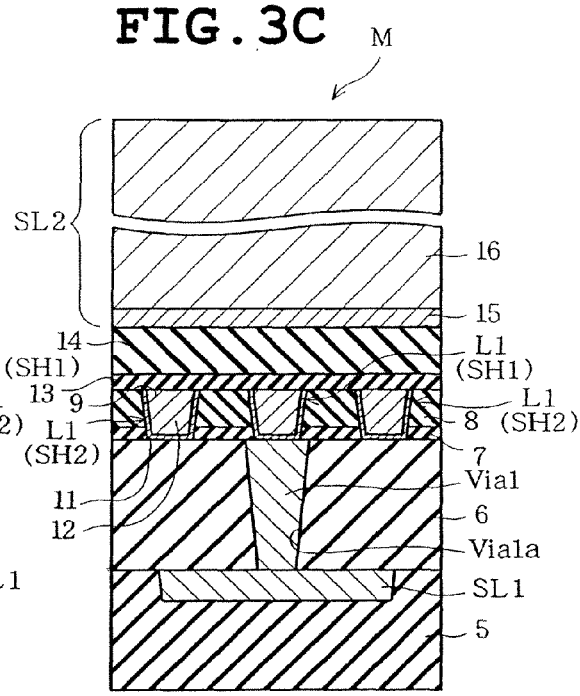
FIG. 3C is a sectional view taken along line 3C-3C in FIG. 2A.
Figure 3B:
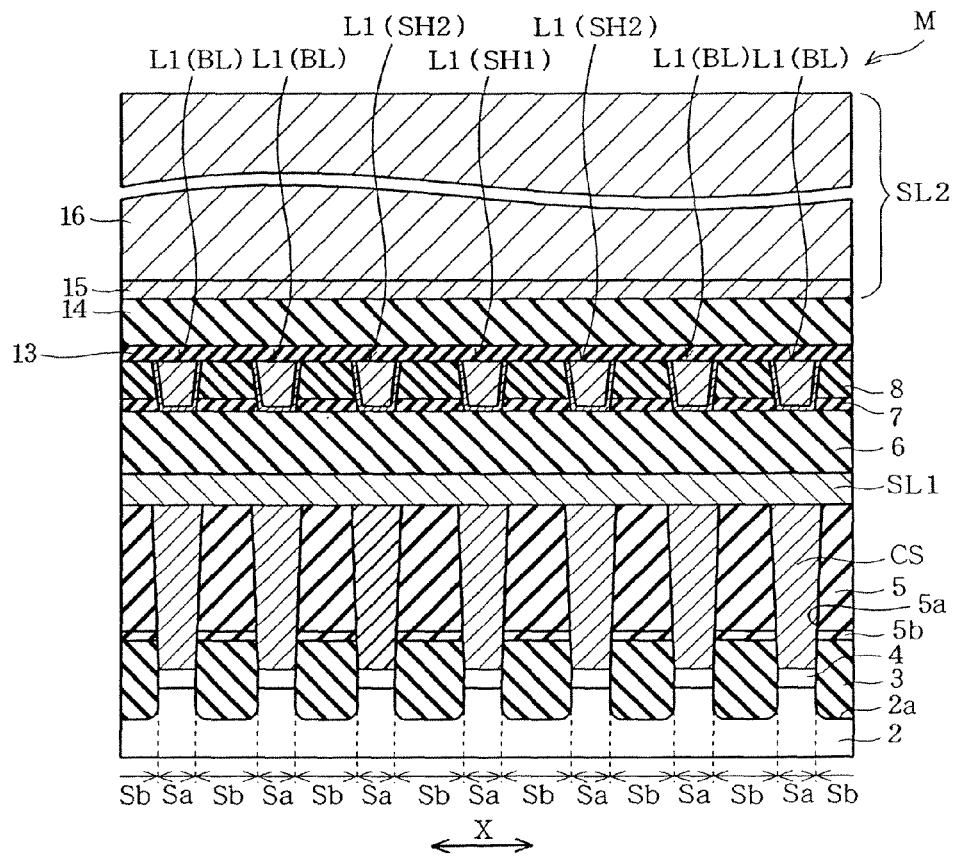
FIG. 3B is a sectional view taken along line 3B-3B in FIG. 2A.

The source line contact CS and a peripheral structure thereof will now be described with reference to FIGS. 2A and 3A to 3C. FIG. 2A is a plan view showing a frame format of the source line contact region CS and a peripheral structure thereof. FIGS. 3A, 3B and 3C are sectional views taken along lines 3A-3A, 3B-3B and 3C-3C in FIG. 2A respectively.

A p-type silicon substrate 2 serving as a semiconductor substrate has a surface layer formed with a plurality of trenches 2a in which element isolation insulating films 3 are buried respectively, as shown in FIG. 3B. The element isolation insulating films 3 constitute element isolation regions Sb which divide the silicon substrate 2 into a plurality of active areas Sa. N-type diffusion layers 4 are formed in the active areas Sa respectively. Interlayer insulating films 5 are formed on the element isolation insulating films 3 with silicon nitride films 5b being interposed therebetween. The silicon nitride films 5b serve as barrier films.

A plurality of contact holes 5a are formed so as to extend upward from upper surfaces of the n-type diffusion layers 4 (silicon substrate 2) through the interlayer insulating films 5 and the silicon nitride films 5b. A plurality of source line contacts CS are buried in the contact hole 55a of the interlayer insulating films 5 respectively. A first metal interconnection SL1 is formed over the source line contacts CS so as to serve as a first source line structure. The first metal interconnection SL1 is electrically connected via the source line contacts CS to the diffusion layer 4 as the result of the first source line structure.

The first metal interconnection SL1 has an upper surface which is substantially in plane with the upper surfaces of the interlayer insulating films 5, as shown in FIGS. 3A and 3C. Although the upper surfaces of the interlayer insulating films 5 are level with the upper surface of the first metal interconnection SL1 in FIGS. 3A to 3C, both upper surfaces are corrugated in actual products. Thus, the substantially planar surface includes the corrugated surface.

An interlayer insulating film 6 is formed on the first metal interconnection SL1 as shown in FIGS. 3A to 3C. A via hole Via1a is formed through the interlayer insulating film 6 formed on the first metal interconnection SL1 as shown in FIGS. 3A to 3C. A via plug structure Via1 (corresponding to second via plug structure) is formed in the via hole Via1a so as to be electrically connected to the first metal interconnection SL1. The interlayer insulating film 6 has an upper surface which is substantially in plane with the upper surface of the via plug structure Via1. The via plug structures (plug) Via1 are formed so as to evade a space above a formation region of the source line contact CS as shown in FIG. 2A, or in other words, the via plug structures Via1 are formed so that planar formation regions thereof differ from planar formation regions of the source line contacts CS.

When the planar formation regions of the via plug structures Via1 and source line contacts CS are overlapped, there is a possibility that the source line contacts CS may be influenced by the etching process in the case where the via holes Via1a are formed through the interlayer insulating film 6. In order that the influence of the etching process may be prevented, the via plug structures Via1 are formed so as to evade the space above the formation region of each source line contact CS.

A thin etch stop film 7 is formed over the interlayer insulating films 6 and via plug structures Via1. An interlayer insulating film 8 is formed on the etch stop film 7. A plurality of elongate holes 9 are formed though the etch stop film 7 and the interlayer insulating film 8 formed on the etch stop film. The elongate holes 9 are formed so as to extend in the Y direction and juxtaposed in the X direction. Second metal interconnections L1 are buried in the elongate holes 9 respectively, thereby being formed into a linear structure. The second metal interconnections L1 have a predetermined widths (the upper surface has the width of about 50 nm) and a predetermined space (the space between ends of the upper surface is about 60 nm) and are juxtaposed in the same layer.

The second metal interconnections L1 are classified into source shunt line structures SH1, dummy interconnection structures SH2 provided at both sides of each source shunt line structure SH1, and a plurality of bit line structures BL.

Each source shunt line structure SH1 is provided for the purpose of reliable conduction between the first metal interconnection SL1 (first source line structure) and the second metal interconnection SL2. Two dummy interconnection structures SH2 are provided at both sides of the source shunt line structure SH1 respectively. Each dummy interconnection structure SH2 serves as a structure which is non-energizable or does not conduct any electrical element. The reason for provision of the dummy interconnection structures SH2 is that variations during the lithography process, such as misalignment of via plug structures Via1 and Via2, are taken into consideration. For example, when at least one of the two dummy structures provided at the both sides of each structure SH1 functions as a bit line structure BL, there is a possibility that the via plug structures Via1 and Via2 may be shorted to the bit line structure BL by the influence of variations in the fabrication. Accordingly, it is convenient that the second metal interconnections L1 provided at both sides of the source shunt function as dummy interconnection structures SH2. Furthermore, it is convenient that the second line structures provided at both sides of each shunt line structure SH1 serve as bit line structures BL provided at block ends respectively.

The aforesaid etch stop film 7 is formed between the source shunt line structure SH1 spaced in the X direction and the dummy interconnection structure SH2 and between the dummy interconnection spaced in the X direction and the bit line structure BL. The reason for the above-described formation of the etch stop film 7 will be described later.

In the sectional structure shown in FIG. 3C, each source shunt line structure SH1 is configured so that at least a part of the lower end thereof (desirably, the whole lower end) is in contact with an upper surface of the via plug structure Via1, and the part is electrically at the same potential as the first metal interconnection SL1. Each second metal interconnection L1 includes a barrier metal film 11 and a metal layer 12 having sides and bottom both covered with the barrier metal film 11. The metal layer 12 serves as a main component of each second metal interconnection L1.

The upper surface of the interlayer insulating film 8 is substantially coplanar with the upper surfaces of the second metal interconnections L1. Although the upper surfaces of the interlayer insulating film 8 is level with the upper surface of the second metal interconnection L1 in FIGS. 3A and 3C, both upper surfaces are corrugated in actual products. Thus, the substantially planar surface includes the corrugated surface. A cap film 13 is formed on the interlayer insulating film 8 and the second metal interconnections L1. An interlayer insulating film 14 is directly formed on the cap film 13. A via hole Via2a is formed through the cap film 13 and interlayer insulating film 14. The via hole Via2a reaches upper surfaces of the source shunt line structures SH1. The via hole Via2a is formed so as to have a planar formation region differing from the source line contact CS and via plug structure Via1. A via plug structure Via2 (first via plug structure, corresponding to a plug) is buried in the via hole Via2a. The via plug structure Via2 has a lower end face with an X-direction width larger than an X-direction width of the upper surface of source shunt line structure SH1, thereby being formed into a borderless contact structure.

The via plug structure Via2 is comprised of a barrier metal film 15 and a metal layer 16 having an underside and sides both of which are covered with the barrier metal film 15. The metal layer 16 is formed inside the barrier metal film 15. The barrier metal film 15 and the metal layer 16 constitute the via plug structure Via2 and a second source line structure SL2. Thus, the multilayer interconnection structure is configured.

Figures 24A, 24B:
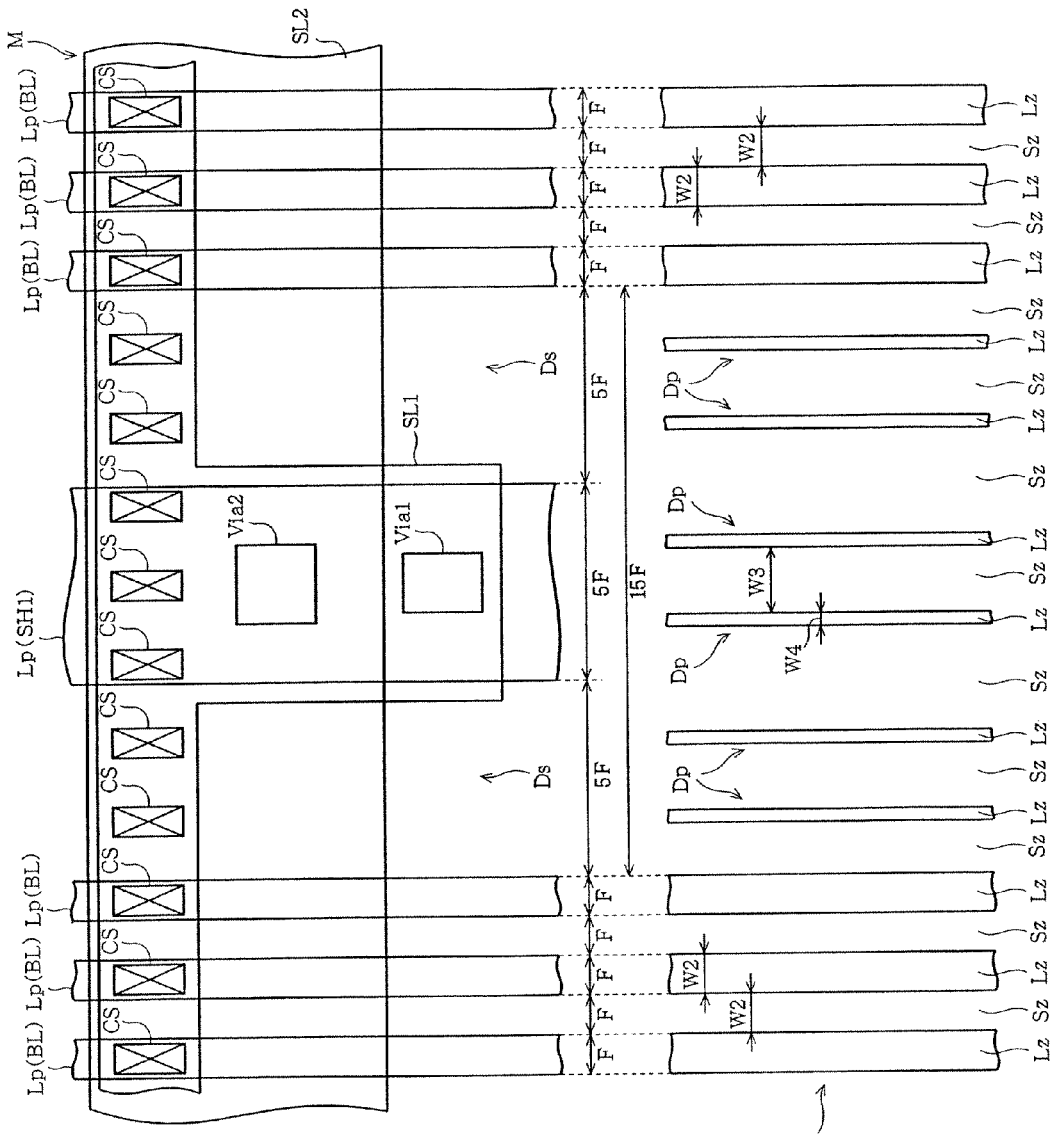
FIG. 24A is a view to be compared with FIG. 2A.
FIG. 24B is a view to be compared with FIG. 2B.

FIG. 24A is a plan view showing a frame format of a source line contact region and peripheral structure thereof employed by the inventors. In FIG. 24A, the bit line structure BL and source shunt line structure SH1 are in the same layer. However, the space between the bit line structure BL and the source shunt line structure SH1 is set so as to be larger than the space between the bit line structures BL adjacent to each other and each width of the bit line structure BL. In the example shown in FIG. 24A, when the width of each bit line structure BL or the space between the bit line structures BL is set to F, the distance between each bit line structure BL and the source shunt line structure SH1 is set to 5F.

Furthermore, the width of the source shunt line structure SH1 is set so as to be larger than the width of the bit line structure BL. In the example of FIG. 24A, the width of the source shunt line structure SH1 is set to 5F. When the semiconductor device is configured as described above, the region shown by about 5F in the X direction needs to be ensured for a single source shunt line structure SH1 and both sides of the structure SH1. For example, when 1000 to 1500 bit line structures BL are provided per chip, the source shunt line structure SH1 is provided for every block usually composed of 100 to 150 bit line structures BL. Accordingly, as shown in FIG. 24A, when the space of about 5F including the dummy space Ds is used for provision of a single source shunt line structure SH1, a chip area is wasted.

According to the arrangement of the embodiment, a plurality of bit line structures BL, the source shunt line structure SH1 and dummy interconnection structure SH2 each of which has a predetermined width and a predetermined space are juxtaposed in the same layer. Accordingly, a larger number of bit line structures BL can be formed as compared with the conventional structures and the arrangement of FIG. 24A. Furthermore, since the second bit line structures BL located at both sides of the source shunt line structure SH1 are formed outwards, widths of dummy spaces provided at both sides of each source shunt line structure SH1 can be reduced. Consequently, the chip area can efficiently be used such that an overall area of the memory cell region M can be reduced.

A fabricating method will now be described with reference to FIGS. 3A to 23. Although a characteristic part of the method in accordance with the invention will be described, one or more of the steps may be eliminated or one or more ordinary steps may be added to the following method. For the sake of description, numeral 100 is added to a reference symbol assigned to each above-described component (structure component) when each component in the fabrication corresponding to the structure component will be referred to hereafter.

Figure 4A:
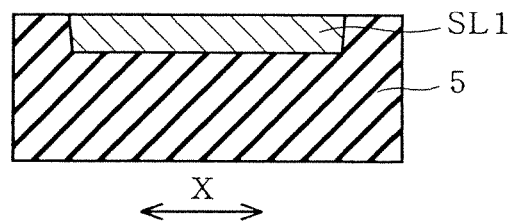
FIG. 4A is a sectional view taken along line 3A-3A or line 3C-3C in FIG. 2A showing a step of fabrication (No. 1)
Figure 4B:
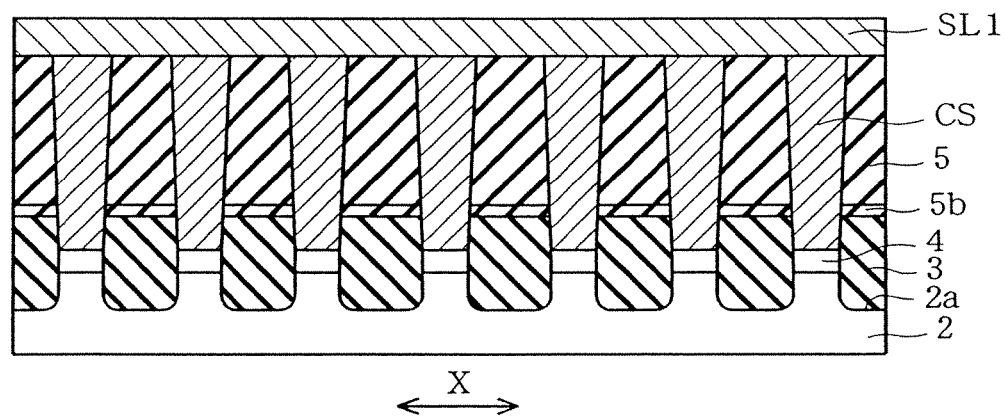
FIG. 4B is a sectional view taken along line 3B-3B in FIG. 2A showing a step of fabrication (No. 1)
Figure 5:
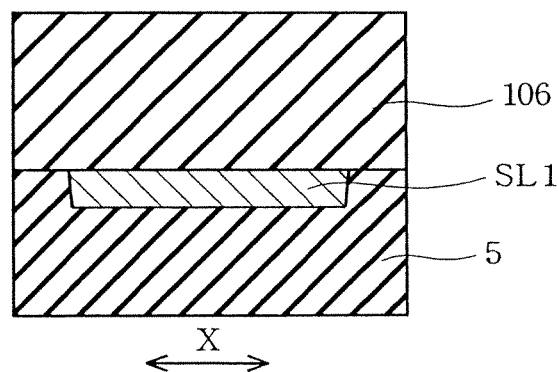
FIGS. 5 to 11 are sectional views taken along line 3C-3C in FIG. 2A showing steps of fabrication (Nos. 2 to 8)

FIG. 4A is a sectional view taken along line 3A-3A or line 3C-3C in FIG. 2A showing a step of fabrication. FIG. 4B is a sectional view taken along line 3B-3B in FIG. 2A showing a step of fabrication.

Ion implantation of impurities is carried out to form n-type diffusion layers 4 in the surface layer of the silicon substrate 2 as shown in FIG. 4B. The n-type diffusion layers 4 serve as source regions. Interlayer insulating films 5 are buried so as to be located above the diffusion layers 4. Subsequently, source line contacts CS are formed in the interlayer insulating films 5 respectively so as to protrude upward over the silicon substrate 2. The first metal interconnection SL1 is formed as the first source line structure so as to pass over the plural source line contacts CS as shown in FIGS. 4A and 4B. The first metal interconnection SL1 is formed in an upper portion of the interlayer insulating film 5 by a damascene process. The first metal interconnection SL1 has an upper surface which is planarized so as to be substantially coplanar with the upper surfaces of the interlayer insulating films 5, as shown in FIG. 4A. The aforesaid substantial coplanarity encompasses error and/or tolerance in the actual fabrication. Regarding planarization, too, the upper surface of the first metal interconnection SL1 has corrugation, curve, bend or the like produced in the actual fabrication.

FIGS. 5 to 11 are sectional views taken along line 3C-3C in FIG. 2A showing steps of fabrication. A silicon oxide film 106 serving as an interlayer insulating film is formed on the interlayer insulating films (first insulating films) 5 and the first metal interconnection SL1 by a high density plasma chemical vapor deposition method (HDP-CVD) using a TEOS gas.

Figure 6:
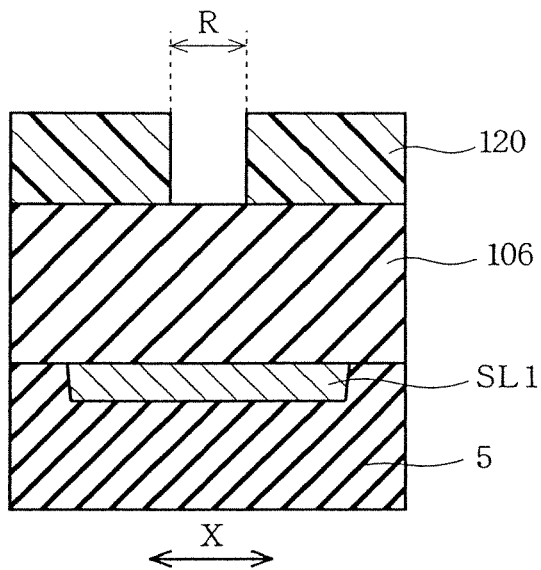
Figure 7:
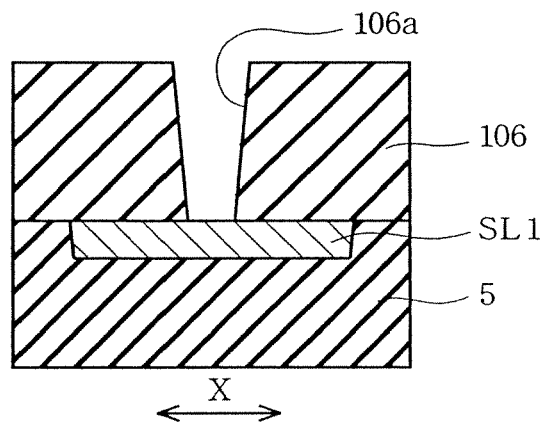

Subsequently, a resist 120 is applied onto the silicon oxide film 106 and patterned as shown in FIG. 6. The resist 120 has an opening region R which is located right above the first source line structure SL1 and which differs from a planar formation region of the source line contact CS.

Figure 8:
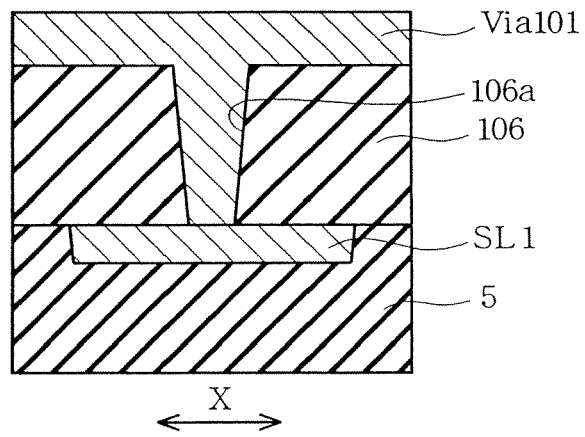

Subsequently, the silicon oxide film 106 is etched by a reactive ion etching process (RIE) with the patterned resist 120 serving as a mask, whereby a hole 106a extending from the upper surface of the first metal interconnection SL1 through the silicon oxide film 106. The formation region of the hole 106a is a predetermined limited planar region (see a formation region of Via1 in FIG. 2A). A wet etching process is then carried out with the use of phosphoric acid. Subsequently, a plug material 101 is buried in the hole 106a as shown in FIG. 8. When the plug material 101 is to be formed, a thin barrier metal film (not shown) is isotropically formed along the upper surface of the silicon oxide film 106. The barrier metal film is made from Ti/TiN/Ti materials. Thereafter, a metal layer comprised of tungsten, for example is formed on an inside of the barrier metal film in the hole 106a and on the barrier metal film formed on the silicon oxide film 106.

Figure 9:
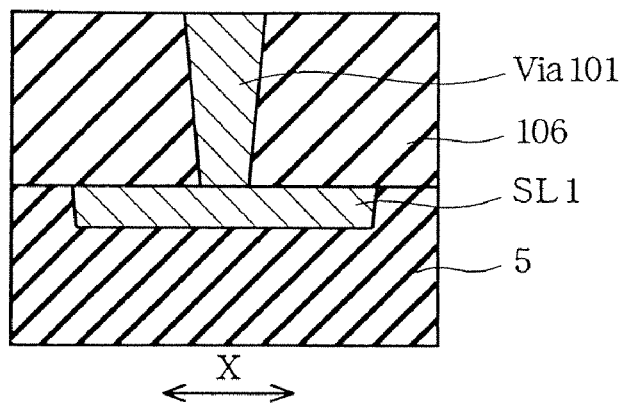
Figure 10:
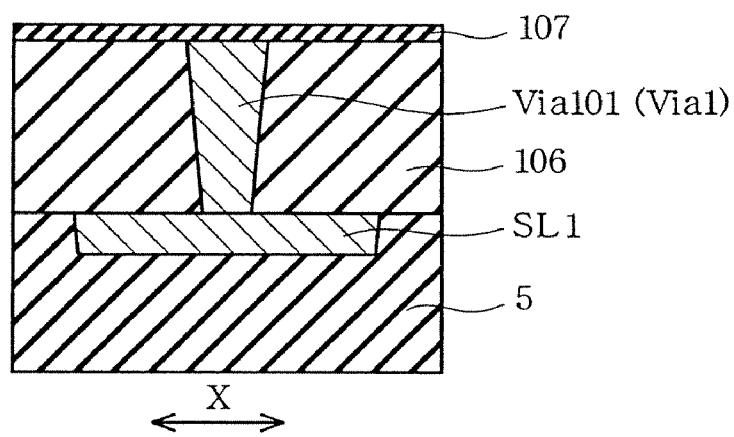
Figure 11:
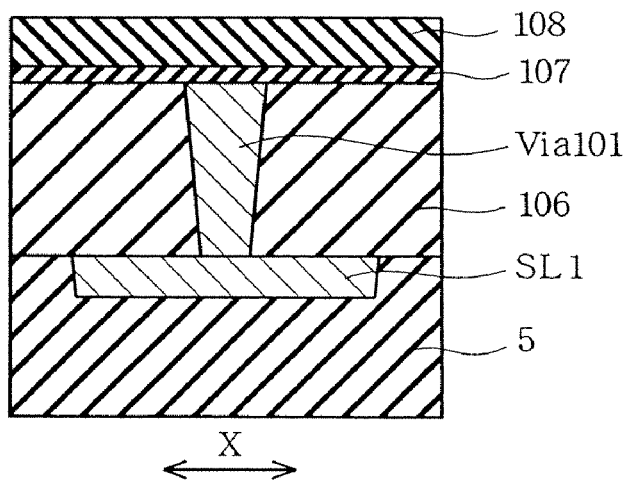

Subsequently, the upper surfaces of the plug material 101 and silicon oxide film 106 are planarized by a chemical mechanical polishing process (CMP) as shown in FIG. 9. In this case, an upper surface of the silicon oxide film 106 is eliminated by a predetermined film thickness (several tends nm, for example). As the result of the planarization process, the upper surfaces of the plug material Via 101 and the silicon oxide film 106 are planarized so as to be substantially coplanar with each other. A via plug structure (first plug) Via1 can be formed in the silicon oxide film 106 by a damascene process through the above-described steps. Subsequently, a silicon nitride film 107 with a predetermined film thickness serving as an etch stop film 7 is formed on upper surfaces of the silicon oxide film 106 and the plug material Via101 as shown in FIG. 10. The silicon nitride film 107 serves as an etch stop film 7. The silicon nitride film 107 is formed as a material which can obtain high selectivity in the etching process in cooperation with the silicon oxide film 106. The silicon oxide film 107 is formed so as to have a smaller thickness (35 nm, for example) than the silicon oxide film 106.

Figure 12:
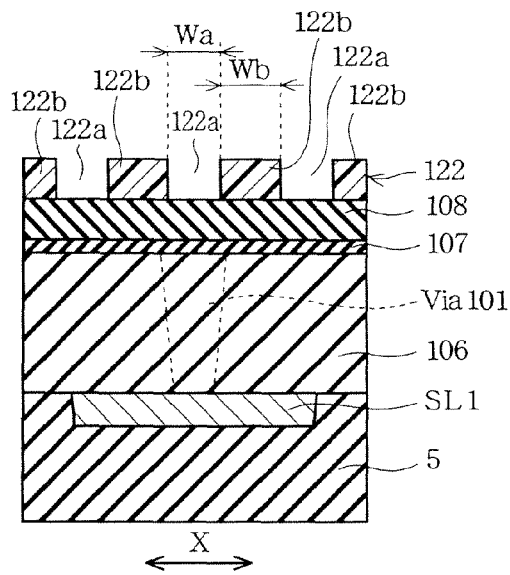
FIGS. 12 to 23 are sectional views taken along line 3A-3A in FIG. 2A showing steps of fabrication (Nos. 2 to 11)

Subsequently, a silicon oxide film 108 is directly formed on the upper surface of the silicon nitride film 107 so as to have a larger thickness (about 100 nm, for example) than the silicon nitride film 107 as shown in FIG. 12. The silicon oxide film 108 serves as an interlayer insulating film. Subsequently, a resist 122 is applied to an upper surface of the silicon and patterned so as to have a predetermined width Wb and a predetermined interval Wa (distance between sidewalls of resists 122 adjacent to each other). In this case, the resist 122 is patterned so that an opening region (space pattern 122a) of a resist pattern is provided above the plug material Via101 and line patterns 122b are provided at both sides of the space pattern 122a. The resist pattern (mask pattern) has an opening width Wa which is a minimum width approximate to the limitation of value of F in the design rules.

FIG. 2B schematically shows a pattern of photomask M1 which is used in exposure of the resist 122 to light, in relation to the second metal interconnection L1 in FIG. 2A. The photomask M1 has a plurality of line patterns Lz formed in the Y direction and arranged in the X direction as shown in FIG. 2B. Space patterns Sz are provided in spaces between the line patterns Lz. Symbol W1 designates an X-direction width of each line pattern Lz and an X-direction width of each space pattern Sz. Each line pattern Lz shows a semi-transmissive region (about 1 to 9% (about 6%), for example) which half transmits light with a predetermined wavelength (wavelength $\lambda=193$ nm, for example). Each space pattern Sz shows a region which totally transmits light with the aforesaid wavelength (transmittance of 100%).

In an ordinary photomask employing a light-resistant film such as chromium (Cr) film as a resist pattern forming film, when the intervals of mask pattern are narrowed, light is diffused into a dark pattern portion which should not be exposed. Diffused light is intensified such that even the dark pattern portion is exposed to light. When a half-tone phase-shifting mask provided with a semi-transmission region and a transmission region is used, the phase of light having passed through a phase shift film is 180° out of phase. As a result, since light diffused into the dark pattern portion is denied by each other, the dark pattern portion cannot be prevented from being exposed. Thus, a phase shift mask can be applied to fabrication of refined semiconductor devices, instead of conventional photomasks. When the patterns Lz and Sz are reduction projected, the resist 122 can be patterned so as to have the predetermined width Wb and the predetermined interval Wa.

FIG. 24B shows an example of pattern design of a photomask for forming a line structure Lp as shown in FIG. 24A. In order to form a wide source shunt line structure SH1 as shown centrally in FIG. 24A, the inventors have heretofore been driven by necessity to provide dummy spaces Ds at both sides of the source shunt line structure SH1 from the restrictions in a lithography process. In this case, a dummy pattern Dp needs to be drawn on a photomask M2 so as to correspond to the source shunt line structure SH1 (the central region indicated by width 5F in FIG. 24A) and the dummy spaces Ds at both sides of the structure SH1. The dummy pattern Dp is provided to ensure a light intensity margin and is not transferred in exposure. The inventors have wasted much time to design the line pattern Lz and widths W3 and W4 of space pattern Sz which do not correspond to design rule value F.

The bit line structure BL and the source shunt line structure SH1 have the same width and the same interval in the embodiment. Accordingly, the resist 122 can be patterned while the widths of line pattern Lz of the photomask M1 and space pattern Sz are constant. In particular, with recent element refinement, an opening ratio NA in the exposure is set at 0.92 or above. In an exposure process to obtain an opening ratio not less than 0.92, application of line and space pattern is good to ensure a depth of field (DOF). When the line and space pattern is applied, margin relating to the lithography process can reliably be improved, and an optical proximity correction (OPC) of the photomask M1 can be prevented from being complicated. As a result, the design efficiency can be improved.

Figure 13:
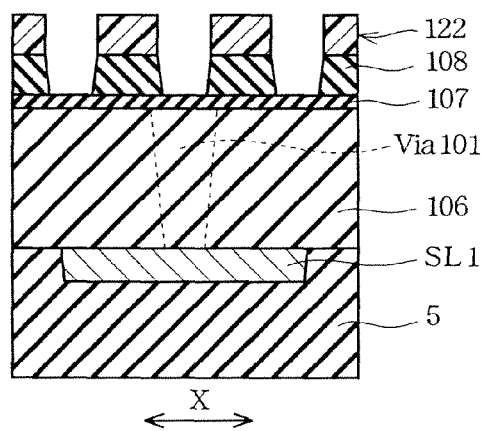
Figure 14:
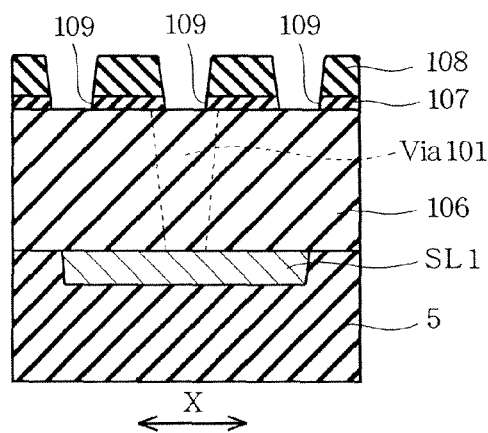

Subsequently, the silicon oxide film 108 is removed by the RIE process with the patterned resist 122 serving as a mask as shown in FIG. 13. A removing process condition for the silicon oxide film 108 is an etching process condition with high selectivity of the silicon nitride film 107. Subsequently, the etching condition is changed so that the silicon nitride film 107 is removed by the RIE process as shown in FIG. 14. A removing condition for the silicon nitride film 107 in this case is an etching process condition with high selectivity of the silicon oxide film 106. Consequently, a plurality of linear elongate holes 109 extending in the Y direction are arranged in the silicon nitride film 107 and silicon oxide film 108 in the X direction.

Figure 15:
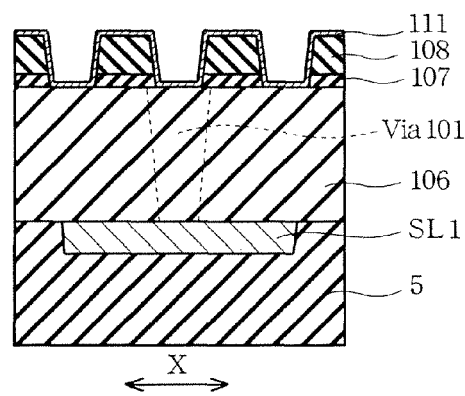
Figure 16:
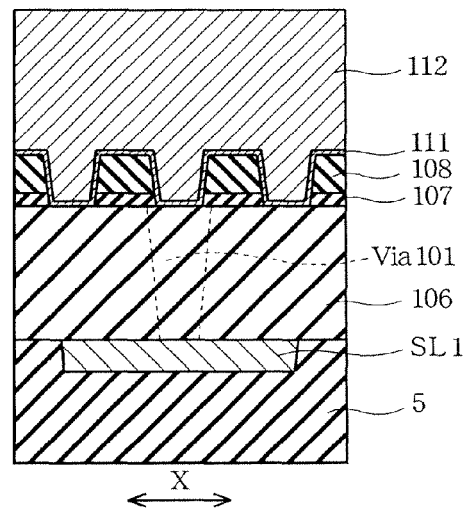

Subsequently, a thin barrier metal film 111 made from Ti/TiN/Ti is formed along sidewalls and upper surfaces of the silicon nitride and oxide films 107 and 108 as shown in FIG. 15. This barrier metal film 111 is formed by a sputtering process so as to have a thickness of about 10 nm. Subsequently, copper (Cu) with a thickness of about 45 nm is formed on the upper surface of the barrier metal film 111 and then copper-plated so that the film thickness of copper is increased, whereby a metal layer 112 is formed, as shown in FIG. 16.

Figure 17:
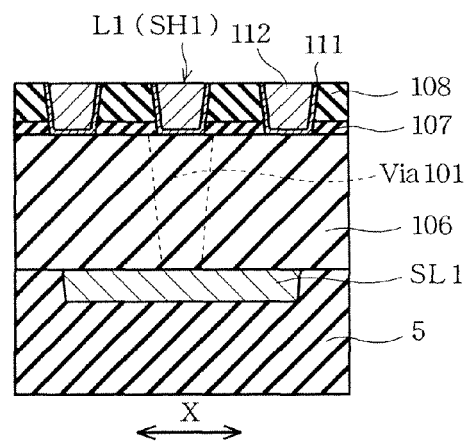

Subsequently, chemical mechanical polishing (CMP) is carried out so that the barrier metal film 111 and the metal layer 112 are planarized, as shown in FIG. 17. As a result, the upper surfaces of the silicon oxide film 108 and barrier metal layer 111 and metal layer 112 are formed so as to be substantially planar. The barrier metal film 111 and the second metal interconnection L1 made of the metal layer 112 can be formed into a line structure extending in the Y direction through these steps. In this case, the second metal interconnection L1 in contact with the plug material Via101 functions as the source shunt line SH1.

Figure 18:
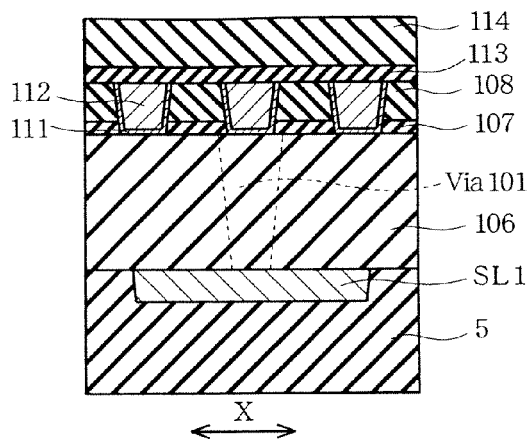
Figure 19:
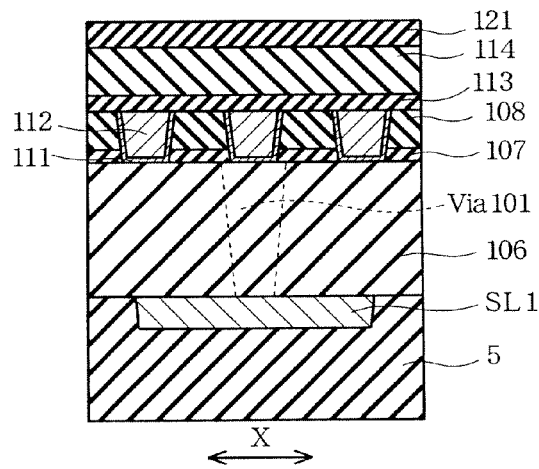
Figure 20:
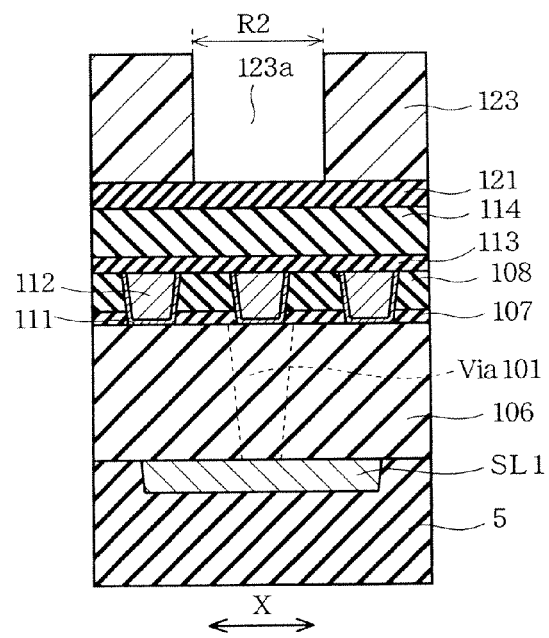

Subsequently, a silicon nitride film 113 with a predetermined film thickness is formed on the barrier metal layer 111, metal layer 112 and silicon oxide film 113 each of which has a planarized upper surface, as shown in FIG. 18. The silicon nitride film 113 is provided to suppress upward diffusion of the material (copper) of the metal layer 112. Subsequently, a silicon oxide film 114 made from a TEOS gas is deposited on the silicon nitride film 113 by a dual frequency RF plasma CVD process. The silicon oxide film 114 serves as an interlayer insulating film. Subsequently, an antireflection film 121 is formed on the silicon oxide film 114 as shown in FIG. 19. A resist 123 is then applied to the antireflection film 121 to be patterned so that a hole pattern 123a is provided over the barrier metal film 111 in contact with the plug material Via101. In this case, the hole pattern 123a has an opening width R2 which is set so as to have a larger X-direction width (about 150 nm, for example) than X-direction width (about 50 nm, for example) of the upper surfaces of the barrier metal film 111 and metal layer 112.

Figure 21:
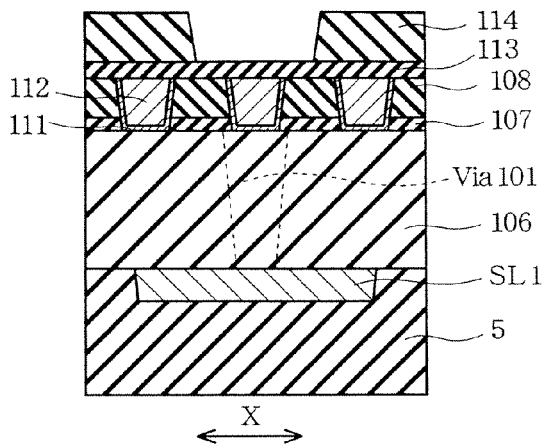
Figure 22:
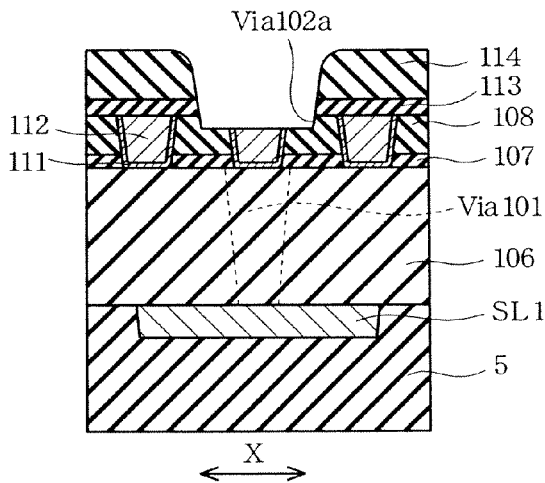

Subsequently, the antireflection film 121 is etched by the RIE process with the patterned resist 123 serving as a mask as shown in FIG. 21. In this case, the etching process is interrupted after the silicon oxide film 114 has been etched. The etching condition in this case allows the silicon oxide film 114 to be etched while having high selectivity of the silicon nitride film 113. Next, an ashing process is carried out to remove the resist 123 and the antireflection film 121. Subsequently, the etching condition is changed so that the silicon nitride film 113 is etched by the RIE process. In this case, the silicon nitride film 113 is excessively etched in order that the upper surfaces of the second metal interconnection L1 (barrier metal film 111 and metal layer 112) are reliably exposed. Parts of the upper surfaces of the barrier metal film 111 and metal layer 112 are etched in turn and at the same time, the upper portion of the silicon oxide film 108 is partially etched, whereby an upper hole Via102a is formed. The upper hole Via102a is formed so as to have a bottom (lower end) with a larger X-direction width than the upper surfaces of the barrier metal film 111 and metal layer 112.

Since the metal layer 112 and the silicon oxide film 108 are set to substantially the same selectivity in the embodiment, the films 111, 112 and 108 have the respective holes which have substantially the same depth to the bottom. The adjustment of depth is carried out by adjusting an etching time. In this case, however, there is a possibility that the holes may have different depths from one semiconductor chip to another. In view of the problem, the silicon nitride films 107 are located beneath the silicon oxide film 108 and provided at both sides of the barrier metal 111 and metal layer 112. The silicon nitride film 107 serves as the etch stop film 7 (107). As a result, the silicon oxide film 106 can be prevented from being eroded by the influence of the etching process even if the depth adjustment results in variations thereof.

Figure 23:
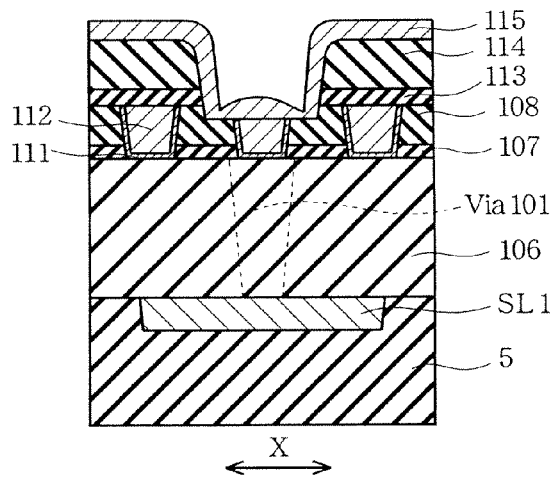

The via plug structures Via1 is located outside the formation region of the via plug structure Via2 in the embodiment as shown in FIG. 2A. Accordingly, even if processing is continued for such a period of time that the upper surface of the silicon oxide film 106 is etched when the upper hole Via102a necessary to form the via plug structure Via2 is formed, the via plug structure Via1 can be prevented from being influenced by the etching process. Subsequently, the Ti/TiN/Ti films are formed by the sputtering method so that the barrier metal film 115 is formed isotropically, as shown in FIG. 23. The barrier metal film 115 is formed along the inner face of the upper hole Via102a and has a non-uniform film thickness particularly in a part on the inner face of the upper hole Via102a.

Subsequently, the metal layer 16 made from AlCu is deposited on the upper and inner surfaces of the barrier metal film 115 as shown in FIGS. 3A to 3C. Both the via plug structure Via2 and the second source line structure SL2 are then constituted by the barrier metal film 15 (115) and the metal layer 16. The X-direction width of the lower end of the upper hole Via102a is larger than the X-direction width of the upper surface of the second metal interconnection L1. Accordingly, even if a lithography process results in a large amount of X-direction deviation, the lower end of the via plug structure Via2 is reliably brought into structural contact with the upper surface of the source shunt line structure SH1.

According to the above-described method, the plug material Via101 is formed in the silicon oxide film 106. The silicon nitride film 107 is formed on the silicon oxide film 106 and plug material Via101. The silicon oxide film 108 is formed on the silicon nitride film 107. The resist 122 is patterned on the silicon oxide film 108 in the line and space so as to extend linearly in the Y direction and arranged in the X direction. A plurality of elongate holes 109 are formed so that one of the holes 109 extends through the resist 122 thereby to reach the upper surface of the plug material Via101. The second metal interconnections L1 are formed in the holes 109 respectively. In this case, the second metal interconnections L1 in contact with the plug material Via101 are constituted as the source shunt line structures SH1. The silicon nitride film 113 is formed on the second metal interconnections L1 and silicon oxide film 108. The resist 123 is patterned on the silicon nitride film 113 so that the hole patterns 123a are located above the source shunt line structure SH1. The silicon nitride film 113 is etched with the pattern of resist 123 serving as the mask, whereby the upper holes Via102a reaching the source shunt structure SH1 are formed. The barrier metal films 15 (115) and metal layers 16 are formed in the upper holes Via102a respectively.

According to the above-described method, the elongate holes 109 are arranged using the photomask M1 with the line pattern Lz of the same line width and the same interval and the space pattern Sz. Accordingly, the line and space pattern, wider pattern and dummy pattern need not be provided on the same photomask used for formation of the bit line structure BL and source shunt line structures SH1 and SH2. Consequently, the mask designing efficiency can be improved. Moreover, the resist pattern 122 can be prevented from collapse and accordingly, the yield can be improved.

The invention should not be limited by the foregoing embodiment. The embodiment may be modified or expanded as follows. The p-type electrically conductive semiconductor substrate is applied to the silicon substrate 3 in the foregoing embodiment. The p-type semiconductor substrate is employed for the purpose of simplifying the description. A substrate formed with a p- or n-well structure may be applied to the silicon substrate. Alternatively, a semiconductor substrate made from another material may be used. The invention may be applied to another type semiconductor device if the device is provided with a source shunt line structure SH1 and source line structures SL1 and SL2.

Although the via plug Via1 is made of the plug material Via101 comprised of the barrier metal film or metal layer in the embodiment, the via plug Via1 may be made from another conductive material. The same is applicable to the via plug Via2. Furthermore, although the interlayer insulating film 6 is made from the silicon oxide film 106 in the foregoing embodiment, the interlayer insulating film 6 may be made from another insulating film material. Although the etch stop film 7 is comprised of the silicon nitride film 107 in the embodiment, the etch stop film 7 may or may not be provided. Furthermore, the etch stop film 7 may be comprised of an insulating film made from another material. Additionally, the etch stop film 7 may be made from any insulating film material if the etch stop film 7 is made from a material differing from a material of the interlayer insulating film 6 (silicon oxide film 106) and if high selectivity in the etching process can be obtained between the interlayer insulating films 6 and etch stop film 7.

Although the interlayer insulating film 8 is comprised of the silicon oxide film 108 in the foregoing embodiment, the film 8 may be made from any insulating film material if the film 8 is made from a material differing from a material of the etch stop film 7 (silicon nitride film 107) and if high selectivity in the etching process can be obtained between the etch stop film 7 and the film 8. Furthermore, the barrier metal film 11 (111) is made from Ti/TiN/Ti and the metal layer 12 (112) is made from copper (Cu) in the foregoing embodiment. However, each of the film 11 and layer 12 may be made from another material. More specifically, the second metal interconnection L1 may be made from another metal or another conductive material.

Although the cap film 13 is comprised of the silicon nitride film 113 in the foregoing embodiment, the cap film 13 may be comprised of another insulating film material. Furthermore, although the interlayer insulating film 14 is comprised of the silicon oxide film 114 in the foregoing embodiment, the interlayer insulating film 14 may be comprised of another insulating film material. Furthermore, although the barrier metal film 15 (115) is made from Ti/TiN/Ti in the foregoing embodiment, the barrier metal film 15 may be made from another material. Additionally, although the metal layer 16 is made from AlCu in the foregoing embodiment, the layer 16 may be made from another metal. The via plug Via2 may be made from another metal or another conductive material.

Although the via plug Via2 is structurally in direct contact with the upper surface of the source shunt line structure SH1 in the foregoing embodiment, the via plug Via2 may be in contact with sidewalls of the source shunt line structure SH1 as well as the upper surface of the structure. In this case, a contact area can be increased such that a contact resistance value can be lowered. Furthermore, although the dummy interconnection structures SH2 are provided at both sides of the source shunt line structure SH1 in the foregoing embodiment, the dummy interconnection structures SH2 may or may not be provided. More specifically, the dummy interconnection structure may be composed into each bit line BL or may be configured as an auxiliary source shunt line structure supplementing the source shunt line structure SH1.

The upper surface of the via plug Via1 is structurally in contact with the source shunt line SH1 in the foregoing embodiment. However, the upper surface of the via plug Via1 may also be structurally in contact with the auxiliary source shunt line structure (dummy interconnection structure SH2). Furthermore, the upper hole Via102a is formed so as to avoid the formation region of the plug material Via101 in the foregoing embodiment. However, the formation region of the plug material Via101 may or may not be avoided. Additionally, the upper hole Via102a is formed so that the lower end thereof has a larger width than the upper surface of the via plug material Via101. However, the lower end of the upper hole Via102a may or may not be larger than the upper surface of the via plug material Via101.

Although the hole 106a is formed into a rectangular shape in the foregoing embodiment, the hole 106a may be formed in a predetermined square, circular or elliptic region. Furthermore, the elongate holes 109 are formed so that one of the elongate holes 109 extends through the films 107 and 108 and reaches the upper surface of the plug material Via101, in the foregoing embodiment. However, two or more elongate holes 109 may extend through the films 107 and 108 and reach the upper surfaces of the plug materials Via101 respectively. Additionally, although the elongate holes 109 are formed so that one of the elongate holes 109 extends through the films 107 and 108 and reaches the upper surface of the plug material Via101, in the foregoing embodiment. However, one of the holes 109 may reach upper surfaces of two plug materials Via101.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
    a semiconductor substrate;
    a first interlayer insulating film formed above the semiconductor substrate;
    a first source line formed on the first interlayer insulating film;
    a second interlayer insulating film formed on the first source line;
    a plurality of bit lines formed on the second interlayer insulating film so as to extend in a predetermined direction, the bit lines being arranged at same width and same width each other;
    a third interlayer insulating film formed above the bit lines;
    a second source line formed on the third interlayer insulating film; and a source shunt line formed between the second and the third interlayer insulating films, the source shunt line electrically connecting the first and second source lines to each other, the source shunt line being located between the bit lines so as to extend in the same direction as the bit lines, the source shunt line including a width same as the bit lines.

2. The device according to claim 1, further comprising a first via plug formed in the third interlayer insulating film so as to electrically connect the second source line and the source shunt line, wherein the first via plug includes a width which is larger than the width of the source shunt line.

3. The device according to claim 2, further comprising:
a second via plug formed in the second interlayer insulating film so as to electrically connect the first source line and the source shunt line; and
an etch stop film formed on the second via plug.

4. The device according to claim 3, wherein a first portion where the first via plug is formed is different from a second portion where the second via plug superficially.

5. The device according to claim 4, further comprising:
a diffusion layer formed in the semiconductor substrate; and
a source line contact formed in the first interlayer insulating film so as to electrically connect the diffusion layer and the first source line, a third portion where the source line contact is formed is different from the first and the second via plugs superficially.

6. The device according to claim 1, further comprising a dummy wiring provided between the source shunt line and the bit line.

* * * * *